(12) United States Patent
Damien

(10) Patent No.: US 7,444,209 B2
(45) Date of Patent: Oct. 28, 2008

(54) MINIATURE COOLING DEVICE

(75) Inventor: Nicolas D. Damien, Safety Harbor, FL (US)

(73) Assignee: Honeywell International Inc., Morristown, NJ (US)

( * ) Notice: Subject to any disclaimer, the term of this patent is extended or adjusted under 35 U.S.C. 154(b) by 36 days.

(21) Appl. No.: 11/553,089

(22) Filed: Oct. 26, 2006

(65) Prior Publication Data

US 2008/0101014 A1    May 1, 2008

(51) Int. Cl.
G05D 23/00 (2006.01)
H01L 23/34 (2006.01)

(52) U.S. Cl. .................. 700/300; 137/80; 310/315; 251/129.06; 361/688

(58) Field of Classification Search .................. 700/300; 361/688; 251/129.06; 310/315, 317, 328; 137/80, 613, 614.11
See application file for complete search history.

(56) References Cited

U.S. PATENT DOCUMENTS

| | | | | |
|---|---|---|---|---|
| 4,275,693 A | * | 6/1981 | Leckie | 123/447 |
| 4,550,744 A | * | 11/1985 | Igashira et al. | 137/80 |
| 6,003,549 A | * | 12/1999 | Delcroix et al. | 137/614.11 |
| 6,538,884 B1 | * | 3/2003 | Wong et al. | 361/688 |
| 6,776,390 B1 | * | 8/2004 | Boecking | 251/129.06 |
| 6,794,795 B2 | * | 9/2004 | Gallmeyer | 310/315 |
| 7,314,447 B2 | * | 1/2008 | Park et al. | 600/459 |
| 2003/0053293 A1 | | 3/2003 | Beitelmal et al. | |
| 2003/0226987 A1 | | 12/2003 | Gallmeyer et al. | |
| 2004/0140738 A1 | | 7/2004 | Seeley et al. | |

OTHER PUBLICATIONS

UK Intellectual Property Office, "International Search Report", Feb. 7, 2008. Published in: GB.

* cited by examiner

Primary Examiner—Albert Decady
Assistant Examiner—Douglas S Lee
(74) Attorney, Agent, or Firm—Fogg & Powers LLC

(57) ABSTRACT

A method for regulating temperature in an enclosure is disclosed. The method involves monitoring a component temperature inside the enclosure. When the component temperature reaches a threshold, the method injects a coolant into the enclosure. The method further involves regulating a flow rate of the coolant by actuating a miniature piezoelectric element to reduce the component temperature to a prescribed level.

19 Claims, 7 Drawing Sheets

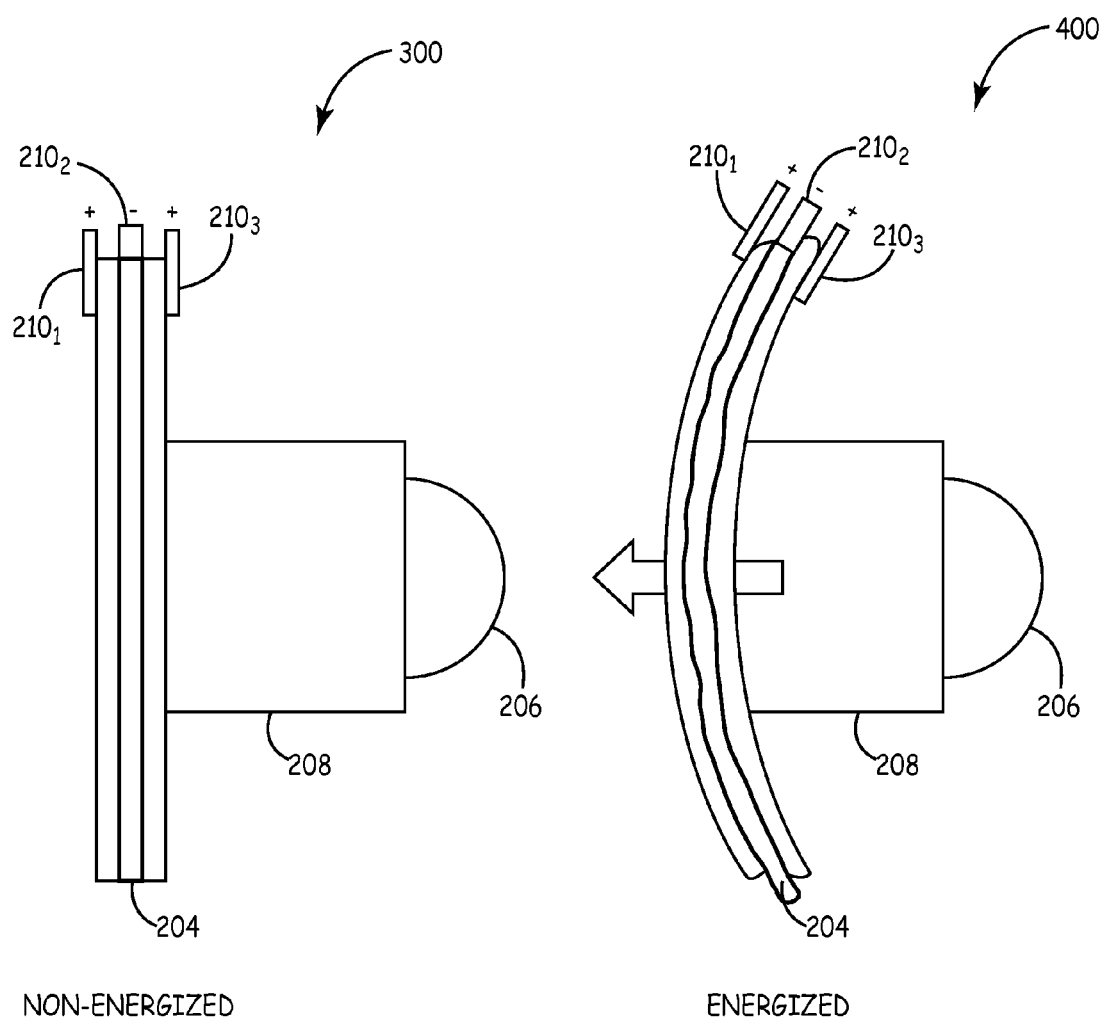

US 7,444,209 B2

MINIATURE COOLING DEVICE

BACKGROUND

Sensitive electronic components must remain within a certain temperature to operate properly. This becomes an engineering challenge when the sensitive electronic components operate in at least one of extreme temperature conditions and high power (and high component density) electronic packaging configurations. A typical example is an inertial guidance system used for oil wellbore exploration (where drilling depths achieve over 12,000 meters). Since the average temperature of the Earth ranges from 15 to 35° C. per kilometer beneath the Earth's surface, the electronic components need to withstand temperatures ranging from 180 to 420° C.

Conventional cooling techniques (such as forced convection cooling) are not suitable in these types of operating environments. Alternatives include cooling only certain (that is, critical) sensitive components susceptible to high temperatures rather than an entire electronic circuit board or assembly. In addition, controlling mechanisms may be necessary to operate a particular cooling system once the temperature of the sensitive electronic components approaches a critical level (threshold).

SUMMARY

The following specification addresses a miniature cooling device for electronic components under extreme operating conditions. Particularly, in one embodiment, a method for regulating temperature in an enclosure is provided. The method involves monitoring a component temperature inside the enclosure. When the component temperature reaches a threshold, the method injects a coolant into the enclosure. The method further involves regulating a flow rate of the coolant by actuating a miniature piezoelectric element to reduce the component temperature to a prescribed level.

DRAWINGS

These and other features, aspects, and advantages will be understood with regard to the following description, appended claims, and accompanying drawings where:

FIG. 3 is a side perspective view of an embodiment of a piezoelectric bending element of FIG. 2 illustrated in a non-energized state;

FIG. 4 is a side perspective view of an embodiment of the piezoelectric element of FIG. 2 illustrated in an energized state;

DETAILED DESCRIPTION

The following detailed description discusses embodiments for a miniature cooling device that cools electronic components in extreme (that is, high temperature) operating conditions. Advantageously, at least one piezoelectric bending element actuates the miniature cooling device to regulate flow of a coolant into an enclosure. The miniature cooling device directs the coolant (for example, pressurized air) at one or more selected electronic components within the enclosure at regular intervals. In at least one embodiment, the miniature cooling device directs the coolant at the one or more selected electronic components when a temperature of the one or more selected electronic components reaches a prescribed level. In one implementation, a temperature sensor circuit monitors the temperature and a valve control circuit controls the at least one piezoelectric bending element. The miniature cooling device directs the coolant at only the one or more selected electronic components for efficient and extended temperature regulation under the extreme operating conditions discussed above.

Figure 1:
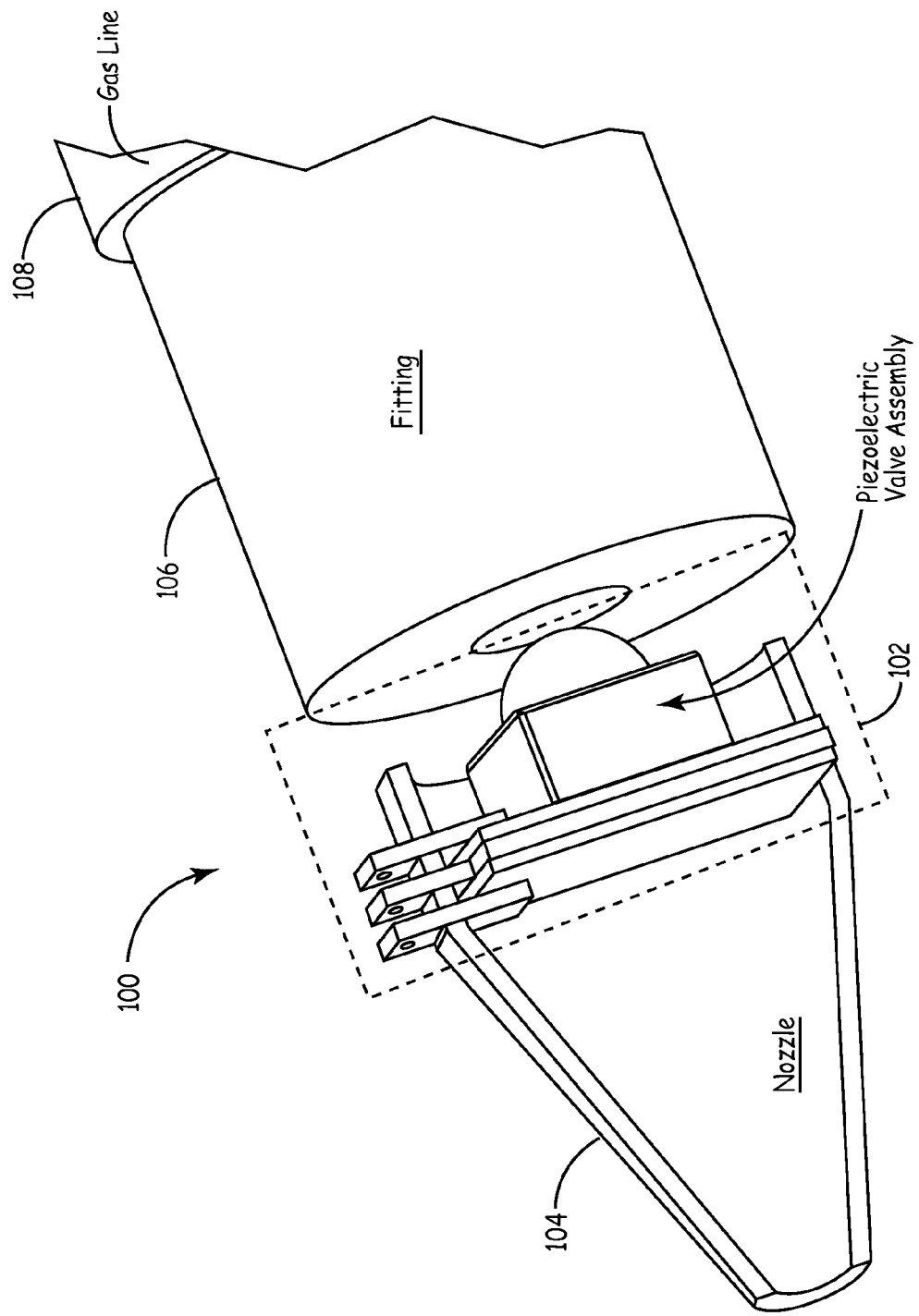
FIG. 1 is a side perspective view of an embodiment of a miniature cooling device.

FIG. 1 is a side perspective view of an embodiment of a miniature cooling device 100. The device 100 comprises a piezoelectric valve assembly 102 coupled to a nozzle 104. The piezoelectric valve assembly 102 is further coupled to a fitting 106. The fitting 106 is coupled to a gas line 108. In the example embodiment of FIG. 1, the gas line 108 is a flexible hose. The device 100 and the piezoelectric valve assembly 102 are further described in FIGS. 2 and 5 below.

In operation, the device 100 controls a flow rate of a coolant from the gas line 108. The device 100 directs the coolant to one or more components (shown below with respect to FIG. 5), the amount of coolant regulated by the piezoelectric valve assembly 102 (as further discussed in detail below with respect to FIG. 2). When the at least one piezoelectric bending element embedded in the piezoelectric valve assembly 102 is activated by an applied voltage, the piezoelectric valve assembly 102 controls the flow rate of the coolant from the gas line 108.

Figure 2:
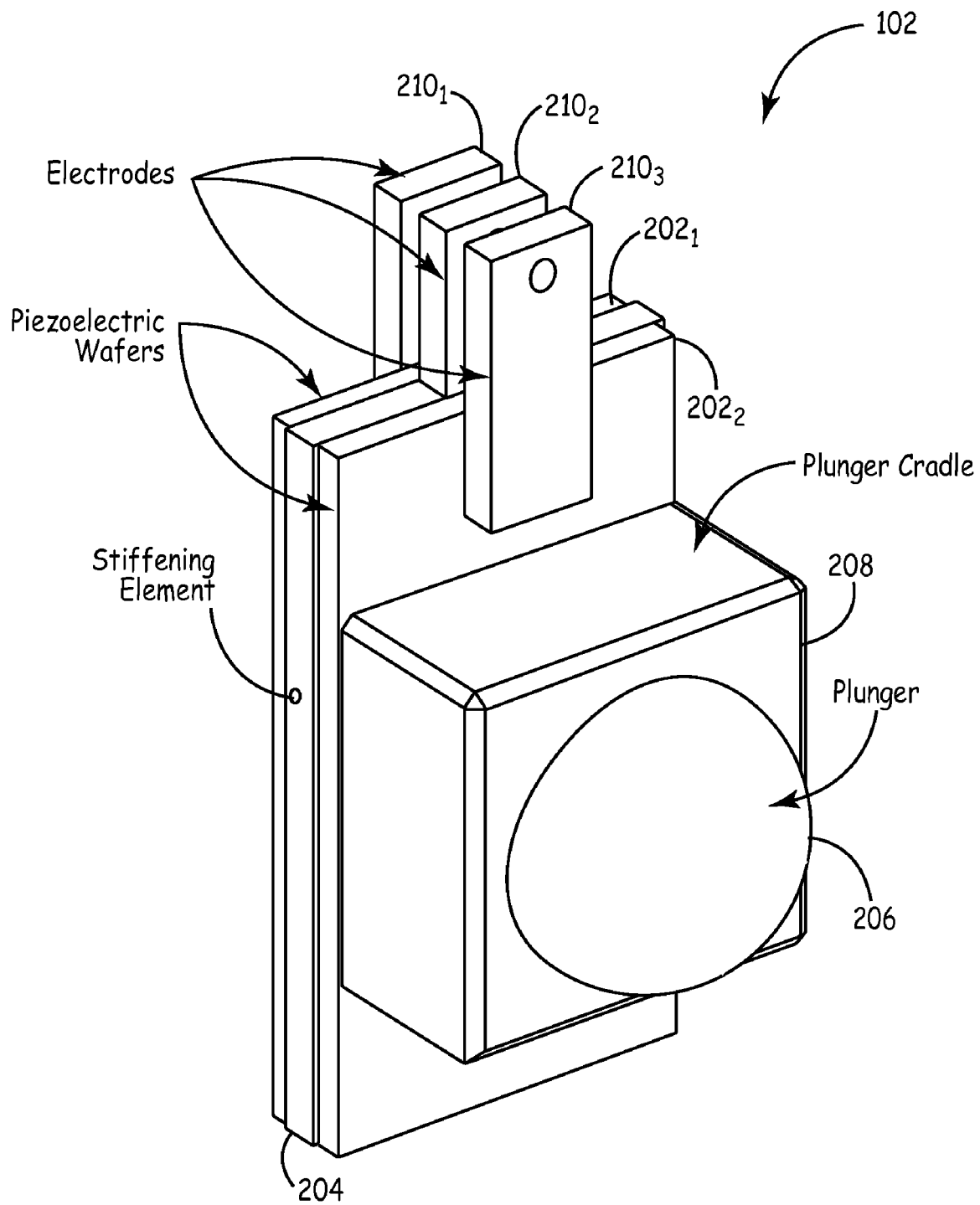
FIG. 2 is a side perspective view of an embodiment of a piezoelectric valve assembly within the device of FIG. 1.

FIG. 2 is a side perspective view of an embodiment of the piezoelectric valve assembly 102 within the device 100. Portions of the piezoelectric valve assembly 102 represent a piezoelectric bending element. The piezoelectric bending element comprises at least two piezoelectric wafers $202_1$ and $202_2$, a stiffening element 204 positioned between the at least two piezoelectric wafers $202_1$ and $202_2$, and at least three electrodes: at least two outer electrodes $210_1$ and $210_3$ and an inner electrode $210_2$. In one implementation, the inner electrode $210_2$ is coupled to the stiffening element 204. In one or more alternate implementations, at least a portion of the stiffening element 204 serves as the inner electrode $210_2$. The piezoelectric valve assembly 102 further comprises a plunger 206 and a plunger cradle 208. In the example embodiment of FIG. 2, the plunger 206 is a precision ball bearing seated in the plunger cradle 208. The plunger cradle 208 adheres to the piezoelectric wafer $202_2$. In a non-energized state (discussed below with respect to FIG. 3), the plunger 206 and the plunger cradle 208 form a seal with the fitting 106 of assembly 100 (FIG. 1).

The operation of the piezoelectric valve assembly 102 will be illustrated with the aid of FIGS. 3 and 4. In one embodiment, the piezoelectric bending element of FIG. 3, indicated generally as 300, is shown in the non-energized state. The piezoelectric bending element 300 comprises all of the components of the piezoelectric element described above with respect to FIG. 2. In the non-energized state, the plunger 206 and the plunger cradle 208 seal an opening in the fitting 106 of FIG. 1. The piezoelectric bending element of FIG. 4, indicated generally as 400, is shown in an energized state. The piezoelectric bending element 400 comprises all of the components of the piezoelectric bending element described above with respect to FIGS. 2 and 3. In response to an applied voltage on the electrodes $210_1$ to $210_3$, the piezoelectric valve assembly 102 operates substantially similar to a bimetallic spring. The principle of operation of the piezoelectric valve assembly 102 is that the at least two piezoelectric wafers $202_1$ and $202_2$, transformed by the applied voltage on the electrodes 210, act on two opposing faces of the stiffening element 204 to shape (bend) the piezoelectric bending element 400 (and effect the seal between the piezoelectric valve assembly 102 and the fitting 106) as illustrated in FIG. 4.

Prior to assembly, the at least two piezoelectric wafers $202_1$ and $202_2$ are metallized to effectively form a two pole electrical circuit. In one implementation, the at least two piezoelectric wafers $202_1$ and $202_2$ are assembled in a "+," "−," "+" arrangement as illustrated in FIG. 3. The stiffening element 204 is mechanically bonded between the at least two piezoelectric wafers $202_1$ and $202_2$. The electrodes $210_1$ to $210_3$ are electrically connected together and an electrical field (that is, a voltage) is applied between the at least two piezoelectric wafers $202_1$ and $202_2$ as illustrated in FIG. 4.

When the piezoelectric bending element in FIG. 4 is energized, the electric field of the piezoelectric wafer $202_1$ is in the same direction as the applied voltage. At the same time, the electric field of the piezoelectric wafer $202_2$ is opposite with respect to the direction of the applied voltage. The piezoelectric wafer $202_2$ increases in thickness and decreases in length while the piezoelectric wafer $202_1$ decreases in thickness and increases in length, resulting in contraction of the piezoelectric bending element as illustrated at 400. The piezoelectric bending element displaces the plunger 206 and the plunger cradle 208 as shown in FIG. 4. The electric field discussed above actuates the piezoelectric valve assembly 102 to break the seal with the fitting 106 of FIG. 1 and allows coolant (for example, pressurized air) to flow through the nozzle 104.

Figure 5:
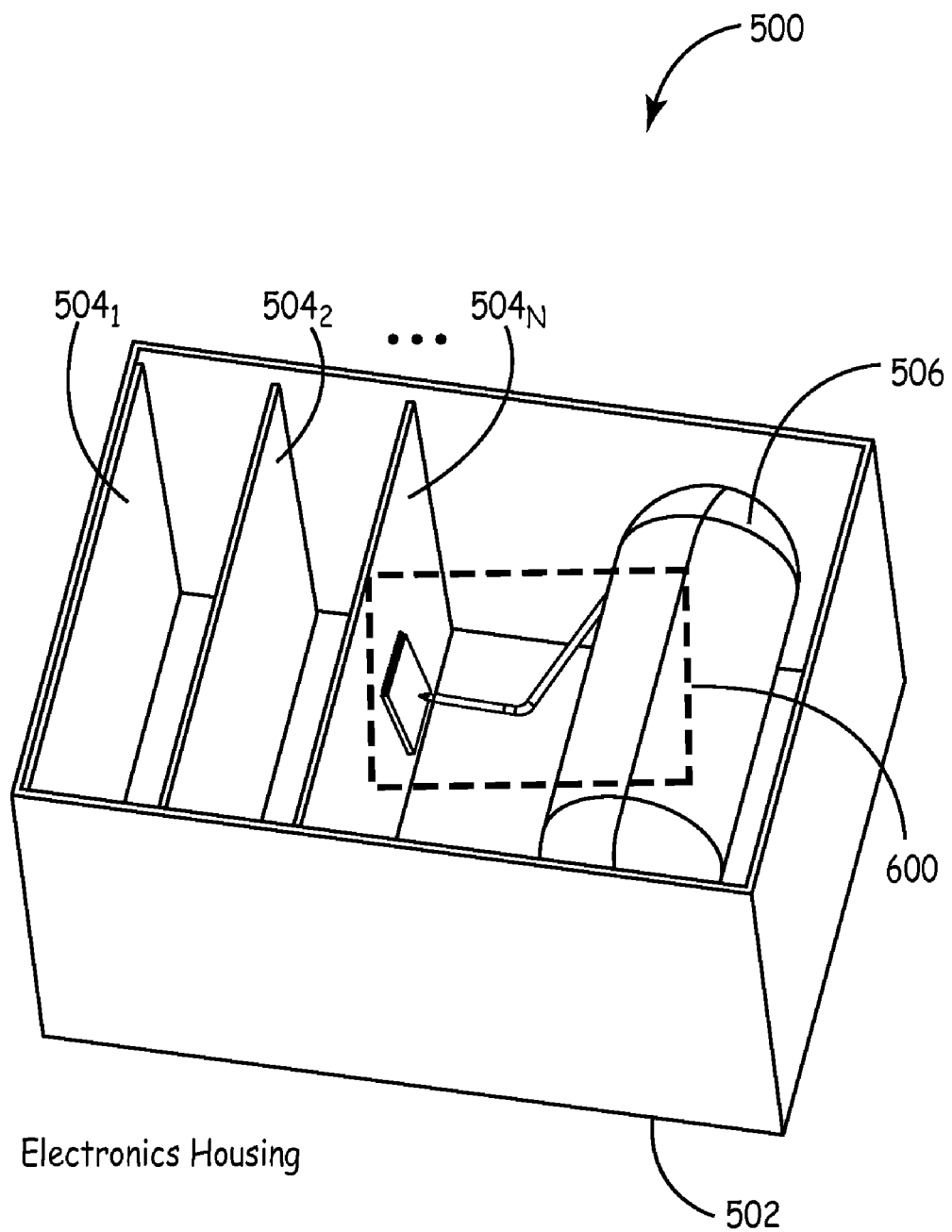
FIG. 5 is a top perspective view of an embodiment of an enclosure incorporating the miniature cooling device of FIG. 1.

FIG. 5 is a top perspective view of an embodiment of an enclosure incorporating the miniature cooling device 100. The enclosure, indicated generally at 500, comprises an electronics housing 502, electronic assemblies $504_1$ to $504_N$ and a gas cylinder 506. It is understood that the electronic housing 502 is capable of accommodating any appropriate number of miniature cooling devices 100 and electronic assemblies 504 (for example, one or more miniature cooling devices 100 and one or more electronic assemblies 504) in a single electronic housing 502. In one implementation, the gas cylinder 506 resides outside the electronics housing 502. The gas cylinder 506 contains at least one of a pressurized gas and pressurized air. A cross-sectional view of the electronics housing 502, indicated in FIG. 5 as section AA, is illustrated below with respect to FIG. 6.

Figure 6:
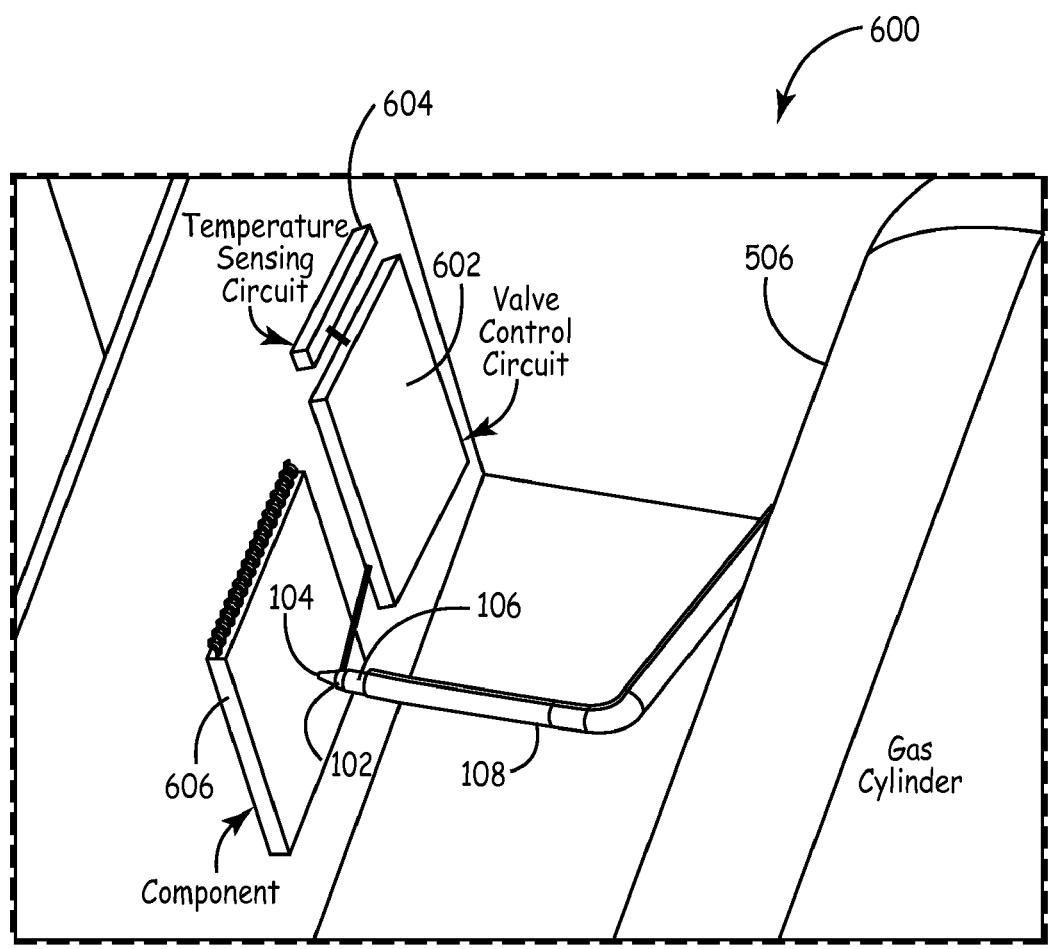
FIG. 6 is a top perspective view of a subsection of the enclosure of FIG. 5.

FIG. 6 is a top perspective view of a subsection 600 of the electronics housing 502 of FIG. 5. In addition to the miniature cooling device 100 of FIG. 1 and the gas cylinder 506 of FIG. 5, the subsection 600 (that is, the gas cylinder 506 and the electronic assembly $504_N$ of FIG. 5) comprises a valve control circuit 602 in communication with a temperature sensing circuit 604. As discussed above with respect to FIGS. 3 and 4, the electrodes $210_1$ to $210_3$ are electrically connected to the valve control circuit 602. The miniature cooling device 100 (including the piezoelectric valve assembly 102, the nozzle 104, the fitting 106, and the gas line 108) is directed at a component 606. It is further understood that the cross-section of the electronic assembly $504_N$ illustrated in section 600 is capable of accommodating any appropriate number of components 606 (for example, one or more components 606) each cooled by a combination of one or more miniature cooling devices 100 in a single electronic housing 502.

In operation, the piezoelectric valve assembly 102 is activated by an applied voltage from the valve control circuit 602. The temperature sensing circuit 604 monitors a current temperature surrounding the at least one component 606. When the temperature sensing circuit 604 senses that the at least one component 606 experiences a prescribed temperature level, the valve control circuit 602 energizes the piezoelectric valve assembly 102. An activated piezoelectric valve assembly 102 displaces the plunger 206 away from the fitting 106. The nozzle 104 of the miniature cooling device 100 directs a gas from the gas cylinder 506 to cool the at least one component 606 on the electronic assembly $504_N$. The piezoelectric valve assembly 102 regulates the rate of flow (that is, the amount) of gas that the gas line 108 supplies to the miniature cooling device 100. Directing the gas on the at least one component 606 reduces the temperature of the at least one component 606 to a level below the prescribed temperature level. The valve control circuit 602 controls the rate of flow of the coolant by energizing the piezoelectric bending element embedded in the piezoelectric valve assembly 102.

Figure 7:
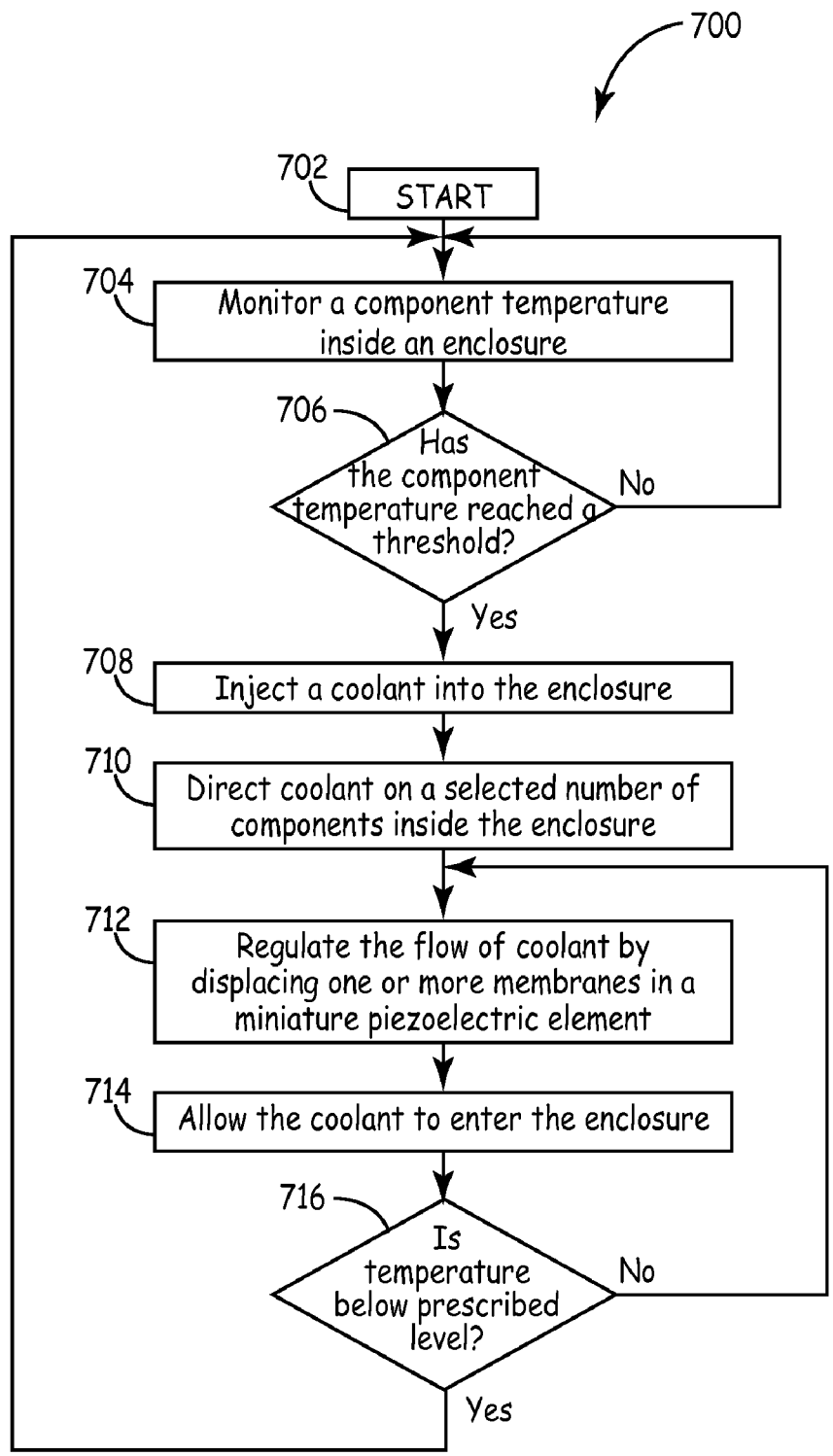
FIG. 7 is a flow diagram illustrating an embodiment of a method for regulating temperature in the enclosure of FIG. 5.

FIG. 7 is a flow diagram illustrating a method 700 for regulating temperature in the enclosure of FIG. 5. The method of FIG. 7 starts at block 702. The method 700 addresses regulating temperature in the electronics housing 502 with the at least one miniature cooling device 100 directed at only selected electronic components (for example, one or more components 606 on one or more electronic assemblies 504). The method 700 provides efficient and extended temperature regulation under the extreme operating conditions discussed above with respect to FIG. 1. The miniature cooling device 100 regulates a flow rate of the coolant to reduce the temperature of the component 606 to a prescribed level. The flow rate is controlled by actuating the plunger 206 with the piezoelectric bending element embedded in the piezoelectric valve assembly 102.

In the example embodiment of FIG. 7, the temperature sensing circuit 604 begins monitoring the temperature of the component 606 at block 704. At block 706, the temperature sensing circuit 604 indicates to the valve control circuit 602 when the temperature of the component 606 reaches a threshold. In one implementation, the temperature sensing circuit 604 measures the temperature of an outer case (that is, a component temperature) of the component 606. Once the threshold is reached, the valve control circuit 602 energizes the piezoelectric valve assembly 102. The piezoelectric valve assembly 102 displaces the plunger 206 away from the fitting 106 and effectively removes a seal between the plunger 206 and the fitting 106. The gas line 108 injects the coolant into the electronics housing 502 at block 708. At block 710, the at least one miniature cooling device 100 directs the coolant on at least a selected number of components (for example, the component 606) within the electronics housing 502. The applied voltage from the valve control circuit 602 regulates the flow of coolant at block 712 by displacing one or more membranes (for example, the stiffening element 204 and the at least two piezoelectric wafers $202_1$ and $202_2$) in the piezoelectric valve assembly 102. As illustrated above with respect to FIG. 4, when one of the membranes contracts, the coolant enters the electronics housing 502 at block 714. The coolant continues to enter the electronics housing 502 (at blocks 712 and 714) from the gas cylinder 506 until the temperature sensing circuit 604 determines that the temperature of the component 606 falls below the prescribed level at block 716. Once the temperature of the component 606 falls below the prescribed level, the valve control circuit 602 de-energizes the piezoelectric valve assembly 102. The piezoelectric valve assembly 102 seals the fitting 106 with the plunger 206 as described above with respect to FIG. 3.

Figure 8:
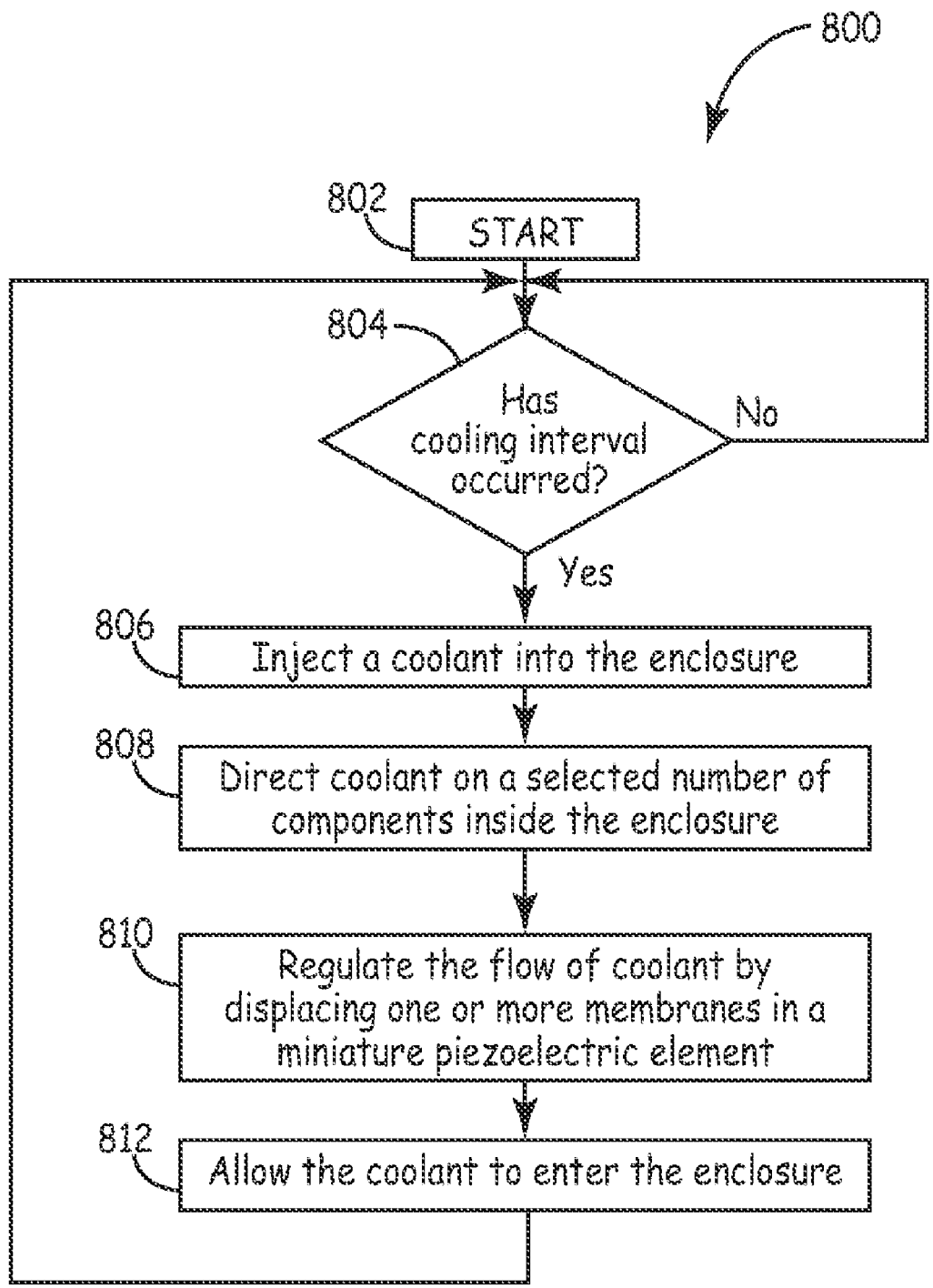
FIG. 8 is a flow diagram illustrating an alternate embodiment of a method for regulating temperature in the enclosure of FIG. 5.

FIG. 8 is a flow diagram illustrating an alternate method 800 for regulating temperature in the enclosure of FIG. 5. The method of FIG. 8 starts at block 802. The method 800 addresses controlling the flow rate of the coolant at regular intervals to reduce the temperature of the component 606. In the example embodiment of FIG. 8, the valve control circuit 602 determines if a cooling interval has occurred (block 804). Once the cooling interval occurs, the valve control circuit 602 energizes the piezoelectric valve assembly 102. The piezoelectric valve assembly 102 displaces the plunger 206 away from the fitting 106 and effectively removes a seal between the plunger 206 and the fitting 106. The gas line 108 injects the coolant into the electronics housing 502 at block 806. At block 808, the at least one miniature cooling device 100 directs the coolant on at least a selected number of components (for example, the component 606) within the electronics housing 502. The applied voltage from the valve control circuit 602 regulates the flow of coolant at block 810 by displacing one or more membranes in the piezoelectric bending element of the piezoelectric valve assembly 102. As illustrated above with respect to FIG. 4, when one of the membranes contracts, the coolant enters the electronics housing 502 at block 812. The coolant continues to enter the electronics housing 502 at block 812 from the gas cylinder 506. Between cooling intervals, the valve control circuit 602 de-energizes the piezoelectric valve assembly 102. The piezoelectric valve assembly 102 seals the fitting 106 with the plunger 206 as described above with respect to FIG. 3. The coolant continues to enter the electronics housing 502 at regular intervals at block 804.

This description has been presented for purposes of illustration, and is not intended to be exhaustive or limited to the form (or forms) disclosed. Variations and modifications may occur, which fall within the scope of the embodiments described above, as set forth in the following claims.

What is claimed is:

1. A method for regulating temperature in an enclosure, the method comprising:
   monitoring a component temperature inside the enclosure;
   when the component temperature reaches a threshold, injecting a coolant into the enclosure; and
   regulating a flow rate of the coolant by actuating a piezoelectric valve assembly within a miniature cooling device inside the enclosure,
   wherein actuating the piezoelectric valve assembly further includes,
      activating at least two piezoelectric wafers having an element interposed there between, thereby bending the element in response to an applied voltage level, and
      in response to the bending of the element, breaking a seal to regulate the flow rate of the coolant to reduce the component temperature to a prescribed level.

2. The method of claim 1, and further comprising injecting the coolant into the enclosure at regular intervals.

3. The method of claim 2, wherein injecting the coolant into the enclosure further comprises directing the coolant on a selected number of components within the enclosure.

4. The method of claim 1, wherein regulating the flow rate of the coolant comprises displacing a plunger from a plunger cradle adhering to one of the at least two piezoelectric wafers to effect the seal.

5. The method of claim 4, wherein displacing the plunger further comprises energizing one or more membranes responsive to the miniature piezoelectric element.

6. The method of claim 5, wherein energizing the one or more membranes responsive to the miniature piezoelectric element comprises:
   contracting at least one of the membranes; and
   allowing the coolant to enter the enclosure.

7. A method for cooling one or more components on an electronic assembly, the method comprising:
   evaluating a current temperature of the one or more components; and
   when the one or more components experience a prescribed temperature level, activating at least one piezoelectric bending element embedded in a miniature cooling device to effect a seal within the miniature cooling device whereby the miniature cooling device directs a flow of gas on the one or more components,
   wherein activating at least one piezoelectric bending element further includes,
      supplying an electric field to energize the at least one piezoelectric bending element and a stiffening element adjacent to the at least one piezoelectric bending element, thereby bending the stiffening element, and
      in response to the bending of the stiffening element, unseating a plunger from a plunger cradle that adheres to the at least one piezoelectric bending element to allow the coolant to flow through the miniature cooling device.

8. The method of claim 7, wherein evaluating the current temperature further comprises sensing the prescribed temperature level with a temperature sensor circuit.

9. The method of claim 7, wherein activating the at least one piezoelectric bending element further comprises regulating the flow of gas to reduce the temperature inside the enclosure below the prescribed temperature level.

10. The method of claim 9, wherein regulating the flow of gas to reduce the temperature comprises shaping the at least one piezoelectric bending element to effect the seal within the miniature cooling device.

11. An electronics housing, comprising
   one or more components residing within the electronics housing; and
   at least one miniature cooling device directed to at least one of the components, the at least one miniature cooling device including:
      a piezoelectric valve assembly, the piezoelectric valve assembly having at least three electrodes and at least two piezoelectric wafers, each piezoelectric wafer coupled to two of the three electrodes, and a stiffening element positioned between the at least two piezoelectric wafers, the stiffening element coupled to a remaining inner electrode,
      a fitting coupled to the at least one piezoelectric valve assembly, the fitting sealed with a plunger seated in a plunger cradle that adheres to one of the at least two piezoelectric wafers,
      at least one gas line coupled to one end of the fitting, and
      wherein the at least one gas line supplies a coolant to reduce a current temperature of at least one of the one or more components to a prescribed level when an electric field is applied to the electrodes to break the seal between the fitting and the at least one gas line to allow the coolant to flow through the piezoelectric valve assembly.

12. The electronics housing of claim 11, and further comprising:
   a cooling source coupled to the miniature cooling device;
   a valve control circuit in communication with the at least one miniature cooling device;
   a temperature sensing circuit in communication with the valve control circuit that monitors the current temperature; and
   wherein the piezoelectric valve assembly of the miniature cooling device is actuated by an applied voltage from the valve control circuit in response to a temperature measurement from the temperature sensing circuit.

13. The electronics housing of claim 12, wherein the cooling source resides outside the electronics housing.

14. The electronics housing of claim 12, wherein the valve control circuit controls a displacement of the piezoelectric valve assembly.

15. The electronics housing of claim 11, wherein the plunger is a precision ball bearing.

16. The electronics housing of claim 11, wherein at least a portion of the stiffening element serves as the remaining inner electrode.

17. The electronics housing of claim 11, wherein the at least one miniature cooling device further includes a nozzle directed at each of the one or more components.

18. The electronics housing of claim 11, wherein the coolant is at least one of a pressurized air and a pressurized gas.

19. The electronics housing of claim 11, wherein the one or more components comprise electronic components operable in high-temperature environments.

* * * * *